United States Patent
Zhang et al.

(10) Patent No.: US 9,836,248 B2
(45) Date of Patent: Dec. 5, 2017

(54) IN-MEMORY DATA COMPRESSION COMPLEMENTARY TO HOST DATA COMPRESSION

(71) Applicant: ScaleFlux, San Jose, CA (US)

(72) Inventors: Tong Zhang, Watervliet, NY (US); Hao Zhong, Los Gatos, CA (US); Fei Sun, Irvine, CA (US); Yang Liu, Milpitas, CA (US)

(73) Assignee: ScaleFlux, San Jose, CA (US)

( * ) Notice: Subject to any disclaimer, the term of this patent is extended or adjusted under 35 U.S.C. 154(b) by 104 days.

(21) Appl. No.: 14/926,172

(22) Filed: Oct. 29, 2015

(65) Prior Publication Data

US 2016/0124683 A1    May 5, 2016

Related U.S. Application Data (60) Provisional application No. 62/072,918, filed on Oct. 30, 2014.

(51) Int. Cl.
*G06F 12/00* (2006.01)
*G06F 3/06* (2006.01)
*G06F 13/28* (2006.01)

(52) U.S. Cl.
CPC .......... *G06F 3/0661* (2013.01); *G06F 3/0608* (2013.01); *G06F 3/0679* (2013.01); *G06F 13/28* (2013.01)

(58) Field of Classification Search
None
See application file for complete search history.

(56) References Cited

U.S. PATENT DOCUMENTS

2008/0219349 A1*  9/2008  Huang ................. H04N 19/176
                                                      375/240.15
2012/0290798 A1* 11/2012  Huang .................. G06F 3/0608
                                                         711/154

OTHER PUBLICATIONS

Crowley et al , Improved Save/Restore, IBM Technical Disclosure Bulletin, 1984.*

* cited by examiner

*Primary Examiner* — Duc Doan
(74) *Attorney, Agent, or Firm* — Hoffman Warnick LLC (57) ABSTRACT

A storage infrastructure, device and associated method for storing compressed data is provided. Included is a method for compressing data on a storage device in a storage infrastructure, including: receiving a compressed extent from a host, wherein the compressed extent includes data compressed with entropy-coding-less data compression; receiving logical identification information about the compressed extent from the host; performing in-memory entropy encoding on the compressed extent to generate a compressed unit; storing the compressed unit in a physical memory; and in a case where the host is aware of the in-memory entropy encoding, reporting size information of the compressed unit back the host.

20 Claims, 8 Drawing Sheets

IN-MEMORY DATA COMPRESSION COMPLEMENTARY TO HOST DATA COMPRESSION

PRIORITY

This application claims priority to U.S. Provisional Patent Application Ser. No. 62/072,918, filed Oct. 30, 2014, which is hereby incorporated herein as though fully set forth.

TECHNICAL FIELD

The present invention relates to the field of data storage and processing, and particularly to providing unified in-memory data storage and compression services in computing systems.

BACKGROUND

Many computing systems carry out lossless data compression to exploit the abundant data compressibility for reducing data storage and transmission overhead. In general, to maximize the compression ratio, lossless data compression includes two steps: (1) a dictionary-type compression scheme, such as various known LZ methods, is first used to compress the original data; and (2) then an entropy coding such as Huffman coding is applied to the output of the first step to further reduce the data volume. In addition, lossless compression is applied either on the file/object level or on the data chunk level. When applying compression on the file/object level, each individual file/object is compressed as a unit and accessing any portion in a compressed file/object demands the decompression from the very beginning of the compressed file/object. When applying compression on the data chunk level, each individual file/object is partitioned into consecutive fix-sized chunks (e.g., each chunk can be 64 kB or 256 kB), and each chunk is compressed (hence can be decompressed) independently from other chunks. Therefore, in the case of chunk-level compression, accessing any portion in a compressed file/object demands the decompression of one compressed chunk.

In current practice, data compression is carried out solely by computing chips such as CPUs and/or GPUs in a host. In many practical systems, particularly very performance-demanding and/or data-intensive systems, implementing both steps of compression (i.e., first dictionary-type compression and then entropy coding) on host processing chips is not a viable option, due to the overall compression implementation overhead in terms of CPU/GPU cycles, cache and DRAM resource, and data transfer. As a result, many systems carry out data compression by eliminating the second-step entropy coding in order to reduce implementation complexity and achieve high-speed compression/decompression.

For example, the high-speed Snappy compression library, which is widely used in many systems such as Google's BigTable and Cassandra, and Hadoop, only implements the first-step dictionary-type compression. Although they can achieve very high compression/decompression speed, such entropy-coding-less compression schemes have worse compression ratio, hence the systems cannot fully exploit the abundant run-time data compressibility to facilitate the data storage and data transfer.

SUMMARY

For computing systems in which host processing chips such as CPUs/GPUs implement high-speed entropy-coding-less data compression (i.e., compression that does not use entropy-coding), this invention presents an approach to implement the entropy-coding based compression at data storage devices, for example flash memory based solid-state data storage devices, and accordingly utilize the additional in-memory data compression gain to improve various system performance metrics, such as effective storage capacity, data transfer throughput, and flash memory endurance (for flash-based storage devices).

In a first aspect, the invention provides a method for compressing data on a storage device in a storage infrastructure, comprising: receiving a compressed extent from a host, wherein the compressed extent includes data compressed with entropy-coding-less data compression; receiving logical identification information about the compressed extent from the host; performing in-memory entropy encoding on the compressed extent to generate a compressed unit; storing the compressed unit in a physical memory; and in a case where the host is aware of the in-memory entropy encoding, reporting size information of the compressed unit back the host.

In a second aspect, the invention provides a storage device, comprising: an input system for receiving a compressed extent from a host, wherein the compressed extent includes data compressed with entropy-coding-less data compression, and for receiving logical identification information about the compressed extent from the host; a compression system that utilizes in-memory entropy encoding on the compressed extent to generate a compressed unit; a physical storage for storing the compressed unit; and an output system for reporting size information of the compressed unit back to the host.

In a third aspect, the invention provides a storage infrastructure, comprising: a host having a host compression system for compressing data into a compressed extent using entropy-coding-less data compression; and a storage device, having: an input system for receiving the compressed extent from the host, and for receiving logical identification information about the compressed extent from the host; an in-memory compression system that utilizes entropy encoding on the compressed extent to generate a compressed unit; a physical storage for storing the compressed unit; and an output system for reporting size information of the compressed unit back the host.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

The described embodiments are generally directed at computing systems having storage infrastructures that employ data compression. More specifically, storage infrastructures are described in which the host carries out only high-speed entropy-coding-less data compression (also referred to herein as system-layer compression), and a storage device (such as a flash memory system) performs in-memory entropy-encoding compression.

Regardless whether the system-layer compression is applied at the file/object level or chunk level, the term compressed extent is used herein to define an indivisible compressed data unit after system-layer compression. As such, accessing any portion within a compressed extent requires the decompression from the very beginning of the compressed extent. For file/object-level compression, each compressed file/object is a compressed extent; for chunk-level compression, each compressed chunk is a compressed extent. Regardless whether system-layer compression is realized at the file/object level or chunk level, the size of compressed extents will vary from one to another.

Figure 1:
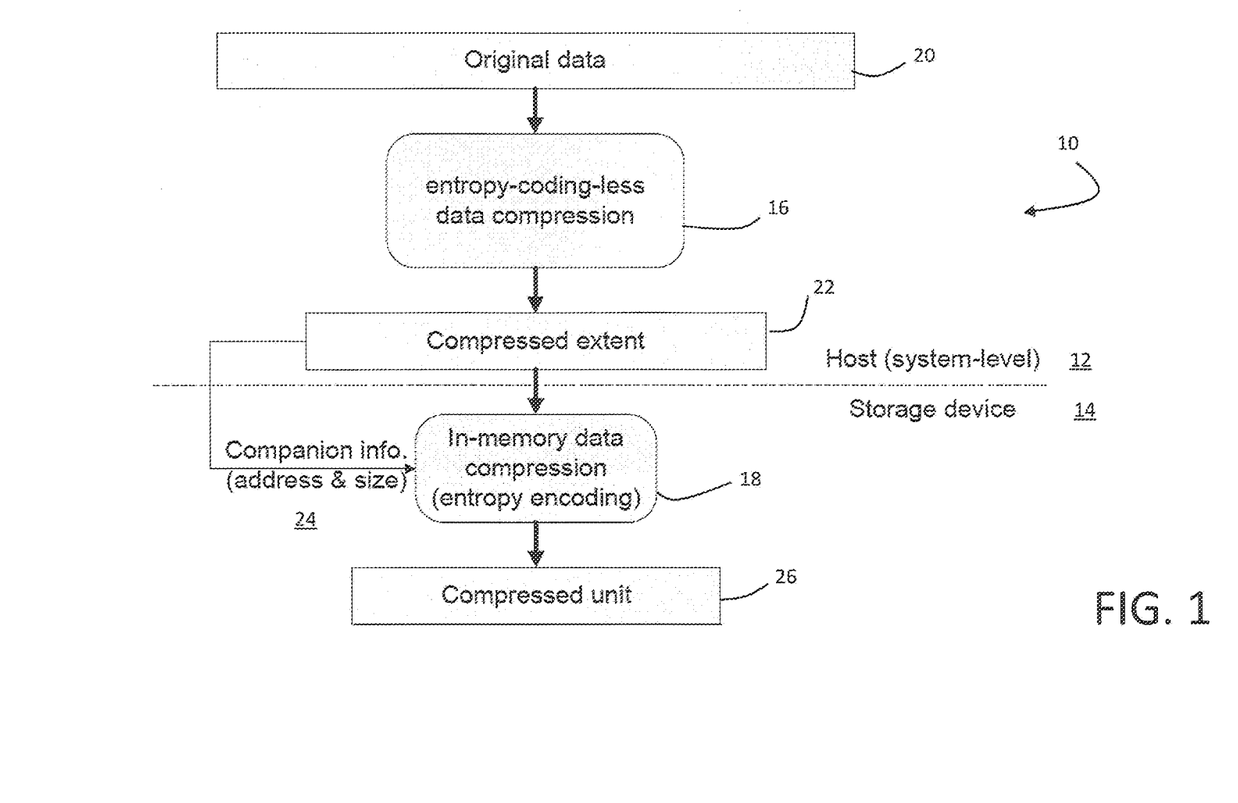
FIG. 1 illustrates a diagram of using in-memory data compression.

FIG. 1 depicts a storage infrastructure 10 involving a host 12 and storage device 14, in which the host 12 implements entropy-coding-less data compression and the storage device implements "in-memory data compression" (i.e., entropy encoding) 18. As shown, when original data 20 is processed for delivery to the storage device 14, host 12 performs entropy-coding-less data compression 16 to generate compressed extents(s) 22 and delivers both the compressed extent(s) 22 and companion information 24 for identifying each compressed extent (e.g., its starting address and size).

Figure 2:
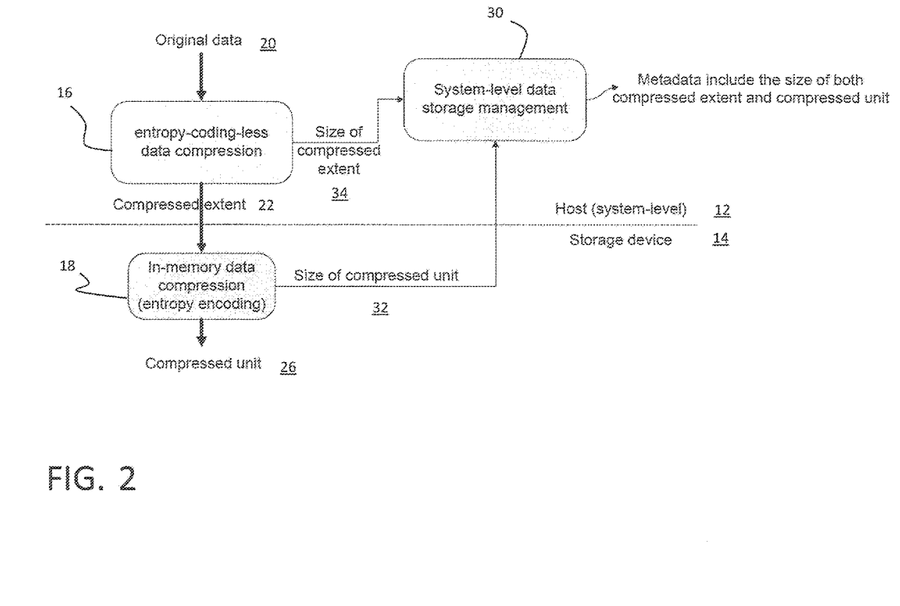
FIG. 2 illustrates a diagram for an operational mode where host is aware of in-memory data compression.

When storing each compressed extent 22, storage device 14 applies entropy encoding 18 to further reduce the data volume, which as noted is referred to as in-memory data compression. To avoid interfering with subsequent operations on the compressed data, in-memory data compression 18 applies entropy encoding for each compressed extent 22 independently from the other extents. After in-memory data compression 18, each compressed extent 22 from host 12 is further compressed into a compressed unit 26. Each compressed unit 26 is stored over a continuous physical address space in storage device 14. The in-memory data compression 18 can leverage the residual data compressibility left by system-layer entropy-coding-less data compression 16 to further reduce the data volume. This infrastructure can be used to improve various system performance metrics, e.g., effective storage capacity, data transfer throughput, and flash memory endurance (for flash-based storage device), which can be implemented to handle the following two different scenarios:

(1) Scenario I: A first operational mode is provided in which host 12 is aware of in-memory data compression 18. The potential of in-memory data compression 18 can be fully exploited if host 12 is aware of the underlying in-memory data compression 18. As shown in FIG. 2, after the in-memory data compression 18 converts each compressed extent 22 from host 12 into a smaller compressed unit 26, storage device 14 reports the effect of in-memory data compression (i.e., the size of the compressed unit 32) to host 12. Accordingly, host 12 incorporates the effect of in-memory data compression into related system-level data storage management 30. As a result, the system-level metadata associated with the compressed extent 22 will contain information about the size of both the compressed extent 34 and compressed unit 32. Accordingly, since the size of compressed unit 32 is the actual storage capacity occupied by each compressed extent 22, host 12 will utilize the size of compressed unit for realizing related system-level data storage management 30. Host 12 also needs to keep the record of the size of the compressed extent 34 because, when the data are read from the storage device 14, the compressed unit 26 is first decompressed into the compressed extent 22 through in-memory decompression, and then recovered before compressed extent 22 is sent to the host memory.

In this scenario, where host 12 is fully aware of the underlying in-memory data compression 18 carried out by storage device 14, host 12 is able to fully leverage the in-memory data compression 18 to improve the effective data storage capacity, data transfer throughput, and flash memory endurance (for flash-based storage device).

Figure 3:
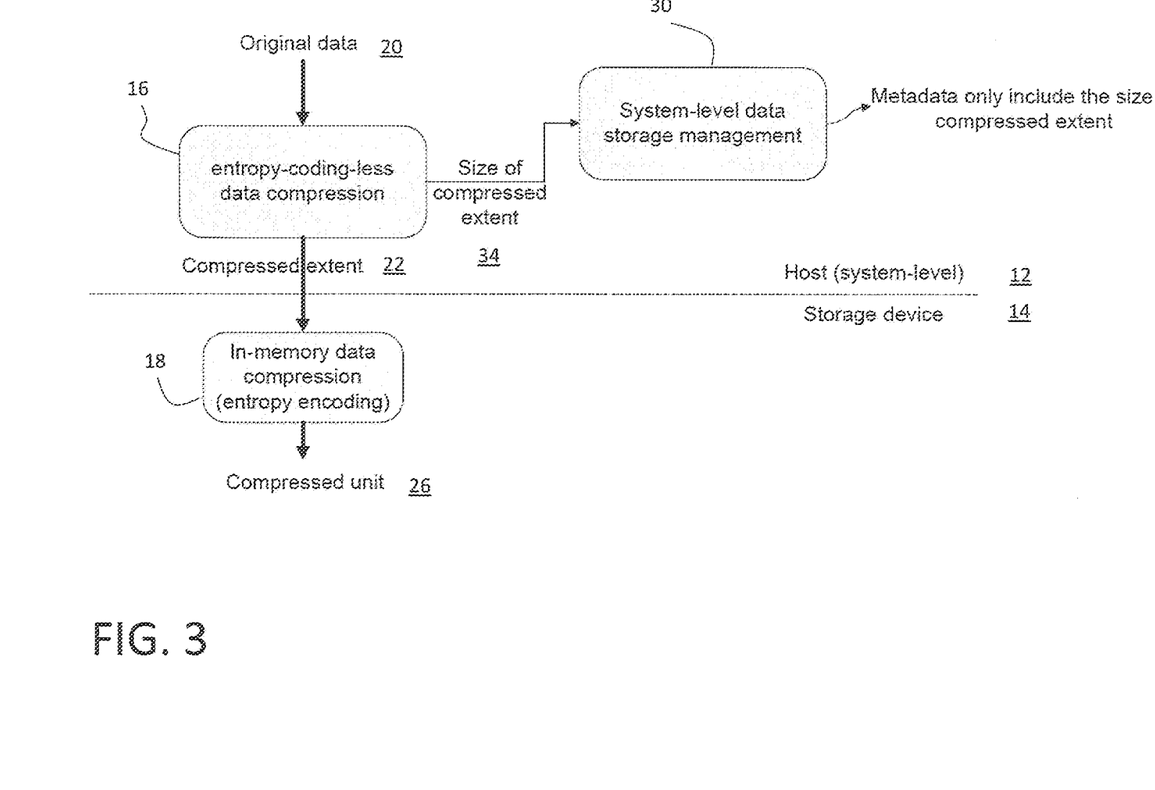
FIG. 3 illustrates a diagram for an operational mode where host is unaware of in-memory data compression.

(2) Scenario II: A second operational mode is provided where host 12 is unaware of in-memory data compression 18. If for any reason storage device 14 is not able to communicate with host 12 regarding the use of in-memory data compression 18, host 12 will not be able to incorporate the resulting effect into the system-level data management 30. As a result, as shown in FIG. 3, system-level metadata associated with each compressed extent 22 can only contain the size of compressed extent 34, and hence the storage capacity visible to the host 12 is solely determined by system-level entropy-coding-less data compression 16. In this case, in-memory data compression 18 may not improve effective data storage capacity visible to host 12. Nevertheless, in-memory data compression 18 can still improve some other performance metrics. For example, for flash-based data storage device, the flash memory endurance can still be improved, since compressed units cause less flash memory cell cycling than compressed extents 22 (therefore extending the lifetime of the memory cells).

Figure 4:
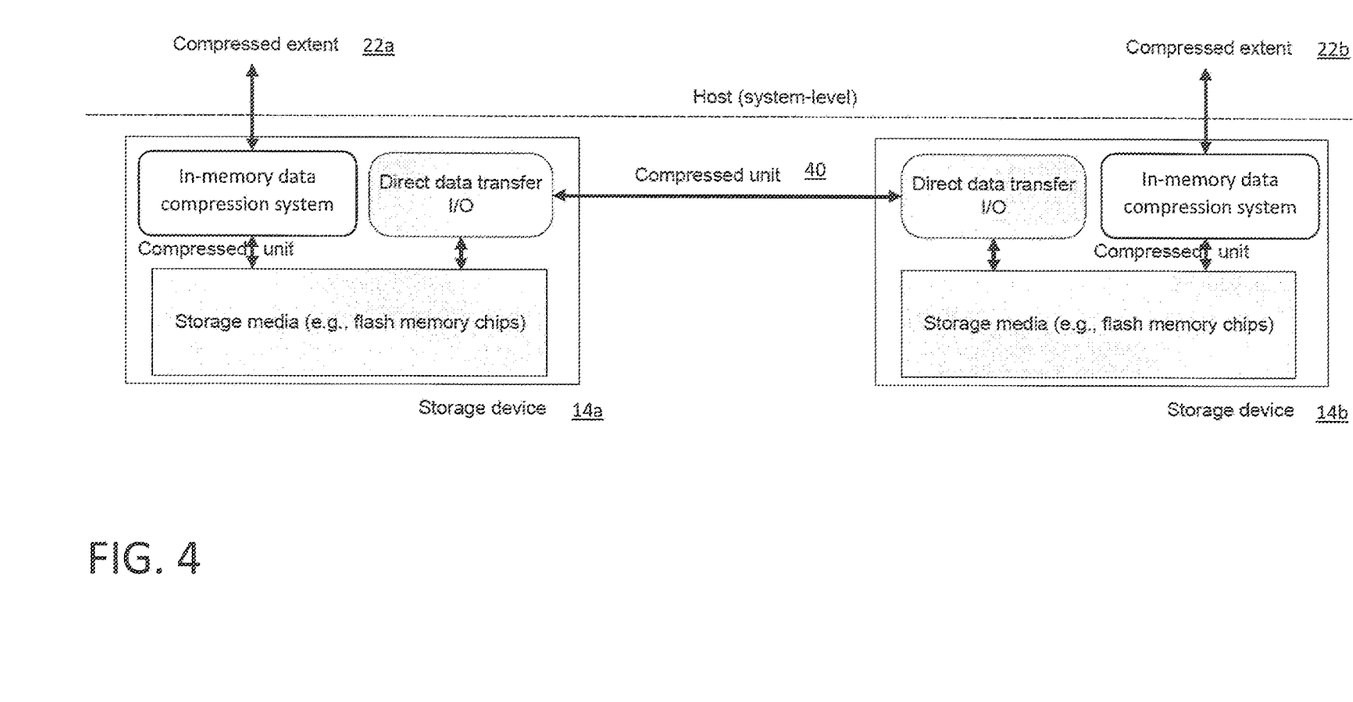
FIG. 4 illustrates a diagram of using in-memory data compression to improve device-to-device data transfer throughput when host is unaware of in-memory data compression.

Another example in which in-memory data compression 18 can improve performance metrics is shown in FIG. 4 involving device-to-device data transfer through, e.g., direct memory access (DMA) or remote direct memory access (RDMA). If both transmitting and receiving storage devices 14a, 14b support in-memory data compression, compressed unit(s) 40 can be directly transferred, i.e., a compressed unit 40 does not need to be converted back to compressed extent 22a, 22b before being directly transferred from one storage device to another.

For either scenario I or II, compressed extent 22 is the minimum data access unit from the host 12 perspective, i.e., for host 12 to access any portion within one compressed extent 22, the entire compressed extent 22 must be fetched and decompressed by host 12. Therefore, storage device 14 treats each compressed unit as a basic storage object, and accordingly uses object-oriented strategies to simplify in-memory physical-level data management.

Figure 5:
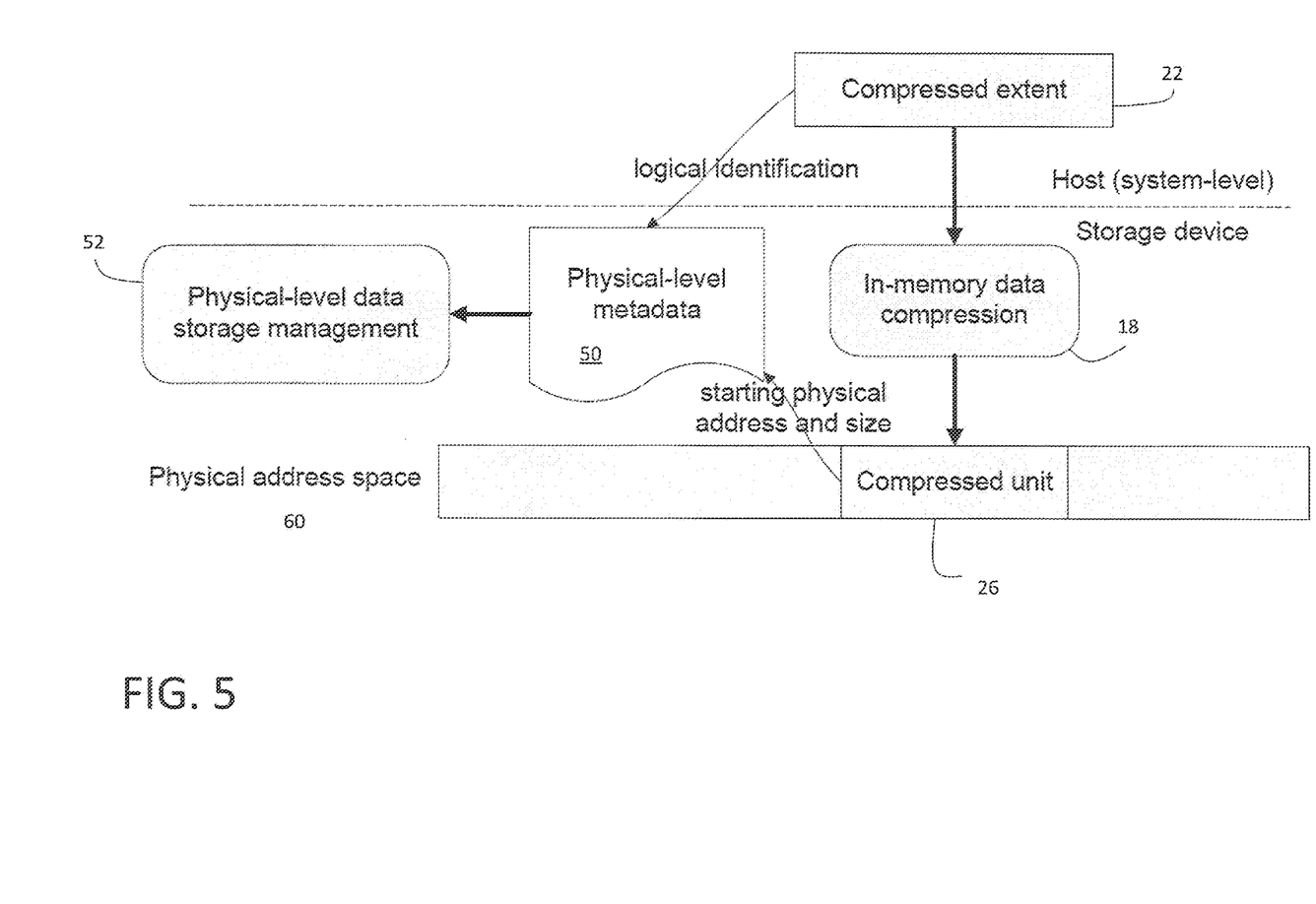
FIG. 5 illustrates a diagram of realizing object-oriented physical-level data storage management.

In particular, as shown in FIG. 5, after converting one compressed extent 22 to a compressed unit 26 through in-memory data compression 18, storage device 14 stores each compressed unit 26 over a continuous physical address space 60. Physical-level (objected oriented) meta-data 50 records the starting physical address and size of each compressed unit 26 on the storage device 14. In addition, for each compressed unit, physical-level meta-data 50 includes a logical identification for the associated system-level compressed extent 22 (e.g., a unique object ID or the starting logical address). Accordingly, storage device 14 only needs to store a small amount of physical-level metadata 50 for each compressed unit 26 being stored in storage device 14. The physical-level object-oriented metadata 50 associated with each compressed unit 26 will be used for storage device 14 to carry out internal physical-level data management 52.

Figure 6:
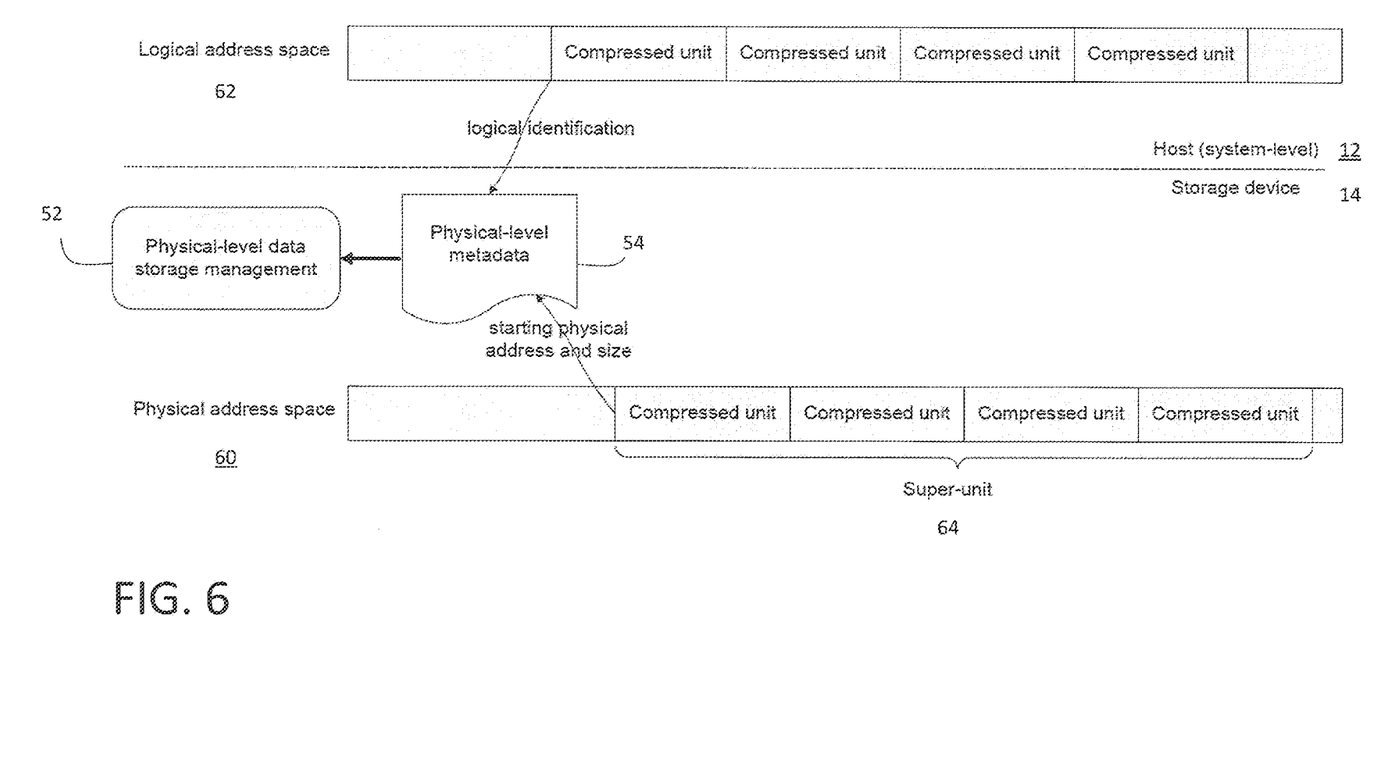
FIG. 6 illustrates a diagram of using a super-unit to reduce physical-level metadata size when host is aware of in-memory data compression.

Furthermore, if host 12 processes a larger set of original data and places multiple compressed extents 22 consecutively over a continuous logical address space, the physical-level object-oriented data management 52 can be further simplified (i.e., physical level metadata can be reduced) as follows:

(1) For the scenario I, i.e., host 12 is aware of in-memory data compression 18 and its effect has been incorporated into system-level data management. In this case, as shown in FIG. 6, storage device 14 treats the multiple compressed units as a super-unit 64, and stores each super-unit 64 over a contiguous physical address space 60. Meanwhile, storage device 14 only keeps the starting physical address and the overall size of the super-unit 64 as the physical-level metadata 54 for in-memory physical-level data management 52.

Figure 7:
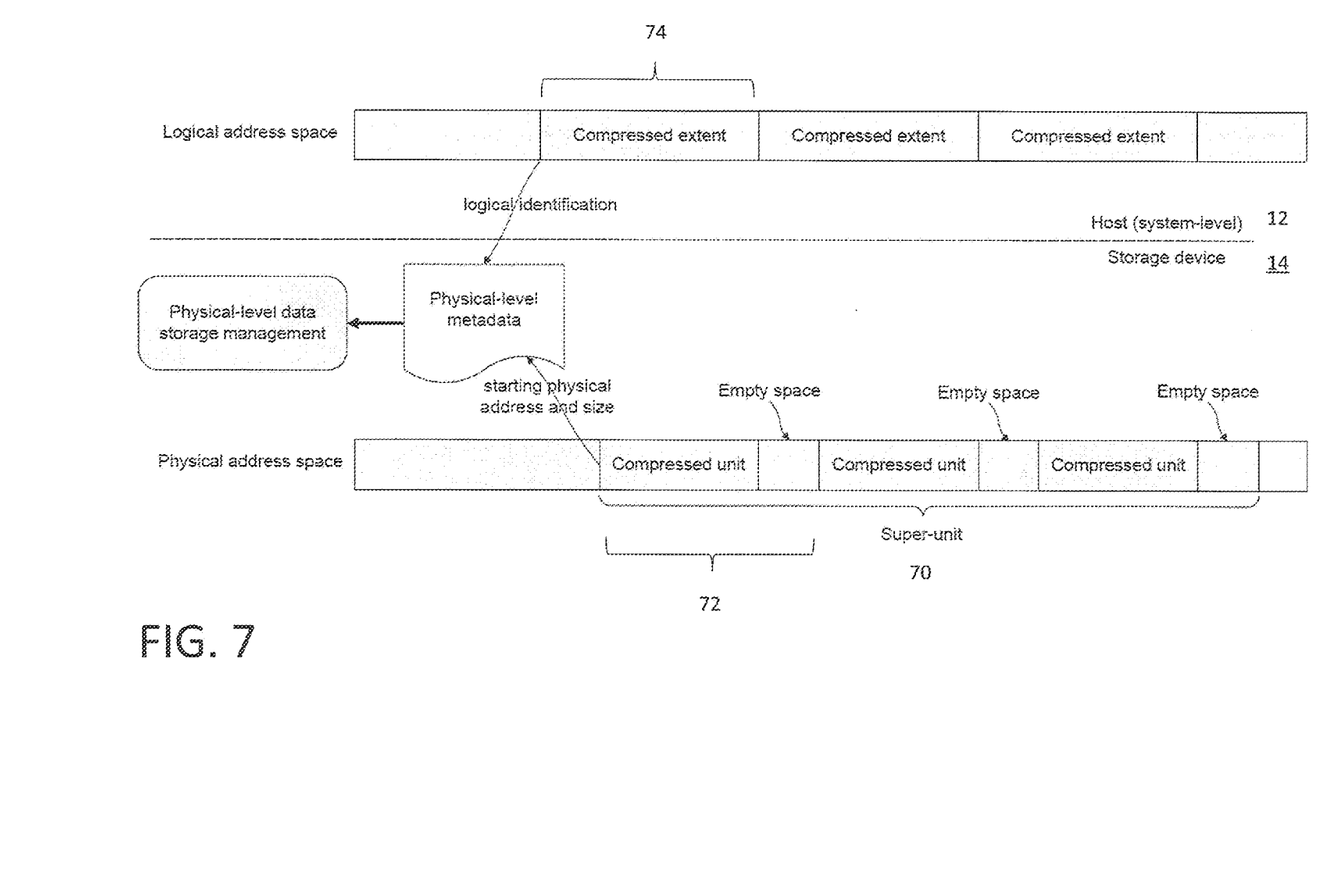
FIG. 7 illustrates the diagram of using a super-unit to reduce physical-level metadata size when host is unaware of in-memory data compression.

(2) For scenario II, i.e., host is unaware of the underlying in-memory data compression, storage device 14 uses the size of all the consecutive compressed extents to allocate a continuous physical address space as a super-unit 70, as shown in FIG. 7. Storage device 14 partitions each super-unit 70 into multiple virtual extents 72, where the size of each virtual extent 72 equals to the size of one compressed extent 74. Within each virtual extent 72, storage device 14 stores the corresponding compressed unit obtained through in-memory data compression, leading to a certain amount of empty space within each virtual extent. As a result, storage device 12 still only needs to keep the starting physical location and the overall size of the super-unit 70 as the physical-level metadata for in-memory physical-level data management. For flash-based storage devices, this approach can reduce the flash memory cell cycling due to the smaller size of compressed unit, leading to improved flash memory endurance.

Figure 8:
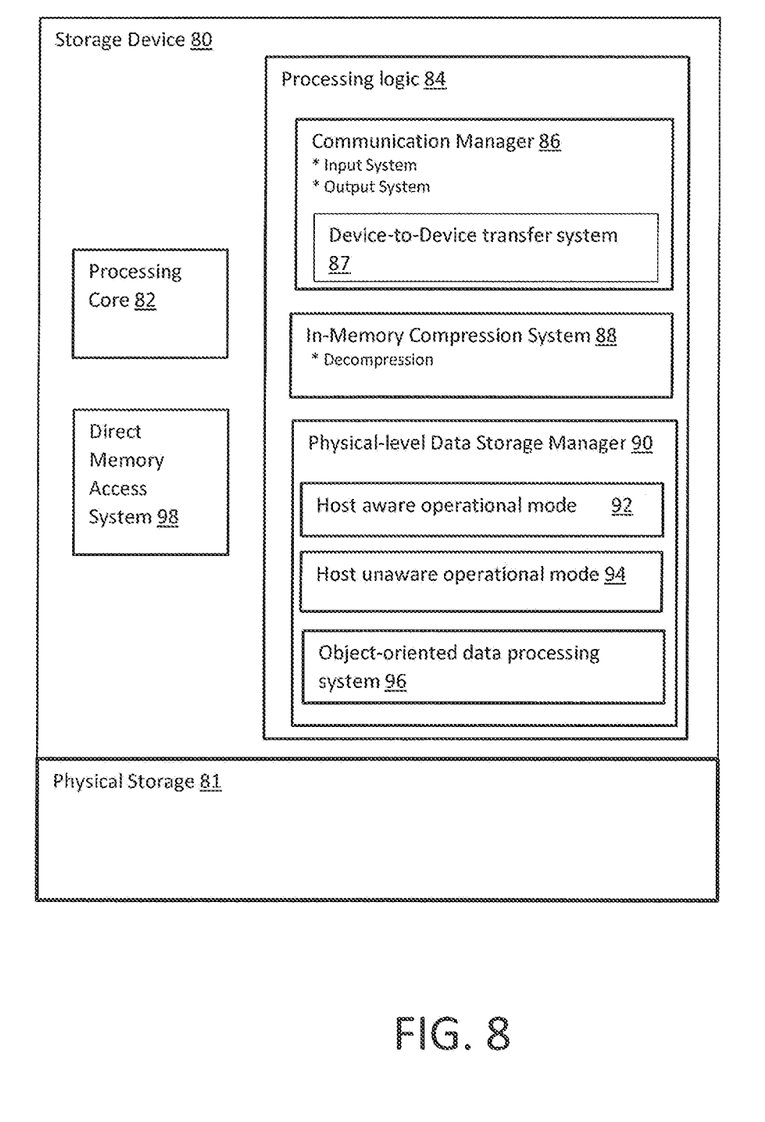
FIG. 8 illustrates a storage device 80 according to embodiments.

FIG. 8 depicts a storage device 80, which may for example be implemented as a flash card or similar device. In general, storage device 80 comprises processing logic 84 that includes a communications manager 86, an in memory compression system 88, and a physical-level data storage manager 90. Also included is physical storage 81, e.g., flash memory, a processing core 82 and a direct memory access system 98.

Communication manager 86 includes an input system for receiving compressed extents from a host and for receiving logical information about the compressed extents, and an output system for outputting data back to the host, including size information regarding compressed units, decompressed data, etc. Also included is a device-to-device transfer system 87 for transferring compressed units back and forth to other storage devices using, e.g., direct memory access system 98.

In-memory compression system 88 provides the logic for implementing entropy based data compression on received compressed extents. Because this processing is done at the storage device level, it does not consume resources of the host, thus allowing for more efficient data handling in the storage infrastructure. In-memory compression system 88 also handles decompression tasks for converting compressed units back to compressed extents.

Physical-level data storage manager 90 includes various facilities for overseeing the storage of data in physical storage 81. Functionality includes determining whether to operate in a host aware operational mode 92 or a host unaware operational mode 94. Note that storage device 80 may be implemented to handle one or both modes 92, 94, i.e., device 80 may be include logic to dynamically (on the fly) or statically (via a predetermined setting) determine if the host is aware of the in-memory entropy compression—or may be implemented to only handle on of the two modes. Physical-level data storage manager 90 further includes an object-oriented data processing system for managing and creating super-units as described herein.

FIG. 8 depicts an illustrative implementation of a storage device 80 that provide in-memory data processing for data being stored in flash memory 28. Device 80 is generally implemented with at least one of an integrated circuit chip ("chip"), FPGA (field programmable gate array) technology, ASIC technology, firmware, software or any combination thereof. Device 80 may for example include a processing core 82, processing logic 84, and other systems such as input/output system, etc. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by processing logic including computer readable program instructions.

Computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The invention claimed is:

1. A method for compressing data on a storage device in a storage infrastructure, comprising:
   receiving a compressed extent from a separately implemented host, wherein the compressed extent includes data compressed with entropy-coding-less data compression;
   receiving logical identification information about the compressed extent from the host;
   performing in-memory entropy encoding on the compressed extent to generate a compressed unit;
   storing the compressed unit in a physical memory; and
   in a case where the host is aware of the in-memory entropy encoding, reporting size information of the compressed unit back the host.

2. The method of claim 1, wherein the storage device comprises flash memory.

3. The method of claim 1, further comprising storing a starting physical address of the compressed unit and a size in a data storage management system on the storage device.

4. The method of claim 1, further comprising:
   receiving a set of compressed extents from the host that reside in a contiguous logic address space on the host;
   performing in-memory entropy encoding on each compressed extent;
   storing a resulting set of compressed units as a super-unit; and
   storing a starting physical address and the overall size of the super-unit in a data storage management system.

5. The method of claim 4, wherein in the case the host is aware of the in-memory entropy encoding, storing the super-unit as a contiguous set of compressed units.

6. The method of claim 4, wherein in a case the host is unaware of the in-memory entropy encoding, partitioning the super-unit into multiple virtual extents, wherein a size of each virtual extent equals a size of one compressed extent.

7. The method of claim 1, further comprising:
   transferring the compressed unit to a second storage device using a direct memory access protocol without decompressing the compressed unit into a compressed extent.

8. A storage device, comprising:
   an input system for receiving a compressed extent from a separately implemented host, wherein the compressed extent includes data compressed with entropy-coding-less data compression, and for receiving logical identification information about the compressed extent from the host;
   a compression system that utilizes in-memory entropy encoding on the compressed extent to generate a compressed unit;
   a physical storage for storing the compressed unit; and
   an output system for reporting size information of the compressed unit back to the host.

9. The storage device of claim 8, wherein the physical storage comprises flash memory.

10. The storage device of claim 8, further comprising a data storage management system that stores a starting physical address of the compressed unit and a size of the compressed unit.

11. The storage device of claim 8, wherein:
    the input system is configured to receive a set of compressed extents from the host that resides in a contiguous logic address space on the host;
    the compression system is configured to perform in-memory entropy encoding on each compressed extent;
    the physical storage stores a resulting set of compressed units as a super-unit; and
    the data storage management system stores a starting physical address and the overall size of the super-unit.

12. The storage device of claim 11, comprising a first operational mode in which the host is aware of the in-memory entropy encoding that stores the super-unit as a contiguous set of compressed units.

13. The storage device of claim 12, comprising a second operational mode in which the host is unaware of the in-memory entropy encoding that partitions the super-unit into multiple virtual extents, wherein a size of each virtual extent equals a size of one compressed extent.

14. The storage device of claim 8, further comprising:
    a direct memory access system for transferring the compressed unit to a second storage device without decompressing the compressed unit into a compressed extent.

15. A storage infrastructure, comprising:
    a host having a host compression system for compressing data into a compressed extent using entropy-coding-less data compression; and
    a storage device implemented separately from the host, having:
        an input system for receiving the compressed extent from the host, and for receiving logical identification information about the compressed extent from the host;
        an in-memory compression system that utilizes entropy encoding on the compressed extent to generate a compressed unit;
        a physical storage for storing the compressed unit; and
        an output system for reporting size information of the compressed unit back the host.

16. The storage infrastructure of claim 15, wherein the storage device further comprises a data storage management system that stores a starting physical address of the compressed unit and a size of the compressed unit.

17. The storage infrastructure of claim 15, wherein:
    the input system is configured to receive a set of compressed extents from the host, where the set of compressed extents resides in a contiguous logic address space on the host;
    the in-memory compression system is configured to perform entropy encoding on each compressed extent;
    wherein the physical storage stores a resulting set of compressed units as a super-unit; and
    the data storage management system stores a starting physical address and the overall size of the super-unit.

18. The storage infrastructure of claim 17, having a first operational mode in which the host is aware of the entropy encoding, wherein the storage device stores the super-unit as a contiguous set of compressed units.

19. The storage infrastructure of claim 17, having a second operational mode in which the host is unaware of the in-memory entropy encoding, wherein the storage device partitions the super-unit into multiple virtual extents, and wherein a size of each virtual extent equals a size of one compressed extent.

20. The storage infrastructure of claim 15, wherein the storage device includes:
   a direct memory access system for transferring the compressed unit to a second storage device without decompressing the compressed unit into a compressed extent.

* * * * *